(12) United States Patent
Bhattacharya et al.

(10) Patent No.: US 7,551,020 B2
(45) Date of Patent: Jun. 23, 2009

(54) ENHANCED OUTPUT IMPEDANCE COMPENSATION

(75) Inventors: Dipankar Bhattacharya, Macungie, PA (US); Makeshwar Kothandaraman, Whitehall, PA (US); John C. Kriz, Palmerton, PA (US); Antonio M. Marques, Newark, NJ (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/755,955

(22) Filed: May 31, 2007

(65) Prior Publication Data

US 2008/0297226 A1    Dec. 4, 2008

(51) Int. Cl.
G05F 1/10 (2006.01)
G05F 3/02 (2006.01)

(52) U.S. Cl. .................. 327/538; 327/540; 327/541; 327/543

(58) Field of Classification Search .......... 327/538, 327/540, 541, 543, 108; 323/315
See application file for complete search history.

(56) References Cited

U.S. PATENT DOCUMENTS

| | | | | |
|---|---|---|---|---|
| 5,296,756 A | * | 3/1994 | Patel et al. | 326/21 |
| 5,517,152 A | * | 5/1996 | Miki et al. | 327/530 |
| 5,532,616 A | * | 7/1996 | Keeney | 326/30 |
| 5,606,275 A | * | 2/1997 | Farhang et al. | 327/108 |
| 6,060,907 A | * | 5/2000 | Vishwanthaiah et al. | 326/87 |
| 6,085,033 A | * | 7/2000 | Starr et al. | 716/14 |
| 6,339,351 B1 | | 1/2002 | Ang et al. | |
| 6,459,320 B2 | * | 10/2002 | Lee | 327/310 |
| 6,466,487 B1 | * | 10/2002 | Otsuka | 365/189.05 |
| 6,509,757 B1 | * | 1/2003 | Humphrey | 326/30 |
| 6,653,882 B2 | * | 11/2003 | Raychaudhuri | 327/270 |
| 6,670,821 B2 | * | 12/2003 | Ajit | 326/32 |
| 6,737,909 B2 | * | 5/2004 | Jaussi et al. | 327/541 |
| 6,784,690 B2 | * | 8/2004 | Tran et al. | 326/30 |
| 6,897,713 B1 | * | 5/2005 | Nguyen et al. | 327/541 |
| 6,998,875 B2 | * | 2/2006 | Lundberg | 326/87 |
| 7,034,575 B2 | * | 4/2006 | Gallo et al. | 326/87 |
| 7,106,638 B2 | * | 9/2006 | Martin | 365/198 |
| 7,184,510 B2 | * | 2/2007 | Jung | 375/374 |
| 7,194,559 B2 | * | 3/2007 | Salmon et al. | 710/8 |

(Continued)

Primary Examiner—Lincoln Donovan
Assistant Examiner—Adam D Houston
(74) Attorney, Agent, or Firm—Ryan, Mason & Lewis, LLP

(57) ABSTRACT

A compensation circuit for compensating an output impedance of at least a first MOS device over PVT variations to which the first MOS device may be subjected includes a first current source generating a first current having a value which is substantially constant and a second current source generating a second current having a value which is programmable as a function of at least one control signal presented to the second current source. A comparator is connected to respective outputs of the first and second current sources and is operative to measure a difference between the respective values of the first and second currents and to generate an output signal indicative of relative magnitudes of the first current and the second current. A processor connected in a feedback arrangement between the comparator and the second current source receives the output signal generated by the comparator and generates the control signal for controlling the second current as a function of the output signal. The processor is operative to control the value of the second current so that the second current is substantially equal to the first current.

20 Claims, 3 Drawing Sheets

U.S. PATENT DOCUMENTS

| | | | |
|---|---|---|---|
| 7,205,828 B2* | 4/2007 | Sridharan | 327/540 |
| 7,208,998 B2* | 4/2007 | Abel | 327/538 |
| 7,209,502 B2* | 4/2007 | Brosnan | 372/28 |
| 7,236,409 B2* | 6/2007 | Isobe | 365/189.11 |
| 7,265,333 B2* | 9/2007 | Ichino et al. | 250/214 R |
| 2002/0043997 A1* | 4/2002 | Stark et al. | 327/170 |
| 2003/0025535 A1* | 2/2003 | Raychaudhuri | 327/108 |
| 2003/0142707 A1* | 7/2003 | Baumgartner | 372/29.021 |
| 2004/0080348 A1* | 4/2004 | Kubo et al. | 327/144 |
| 2004/0119511 A1* | 6/2004 | Stark et al. | 327/112 |
| 2004/0170066 A1* | 9/2004 | Gallo et al. | 365/189.05 |
| 2005/0059372 A1* | 3/2005 | Arayashiki et al. | 455/252.1 |
| 2005/0099215 A1* | 5/2005 | Hsu et al. | 327/157 |
| 2005/0185746 A1* | 8/2005 | Jung | 375/374 |
| 2005/0237094 A1* | 10/2005 | Stark et al. | 327/170 |
| 2005/0242830 A1* | 11/2005 | Humphrey et al. | 326/30 |
| 2006/0170489 A1* | 8/2006 | Bedarida et al. | 327/543 |
| 2006/0197550 A1* | 9/2006 | Mauthe et al. | 326/30 |
| 2007/0063730 A1* | 3/2007 | Gallo et al. | 326/27 |
| 2007/0132493 A1* | 6/2007 | Fujisawa et al. | 327/158 |
| 2008/0007289 A1* | 1/2008 | Kimura | 326/30 |
| 2008/0048735 A1* | 2/2008 | Saxena | 327/108 |
| 2008/0048766 A1* | 2/2008 | Wang et al. | 327/538 |

* cited by examiner

ENHANCED OUTPUT IMPEDANCE COMPENSATION

FIELD OF THE INVENTION

The present invention relates generally to electronic circuits, and more particularly relates to output impedance compensation techniques in a circuit.

BACKGROUND OF THE INVENTION

In modern electronic circuits, such as, for example, input/output (IO) buffers, it is desirable to control the output impedance of the IO buffers for a variety of reasons, including, but not limited to, transmission line matching, minimizing switching noise (di/dt), optimizing signal swing, etc. Various IO standards, such as, for example, stub series terminated logic (SSTL), high-speed transceiver logic (HSTL), etc., specify the output impedance and/or output current of a receiver at specific values of output voltage (e.g., Vol or Voh) in order to ensure that there is sufficient margin for the receiver to function properly. While most IO standards specify an upper limit for output impedance (or a lower limit for output current), switching noise and/or transmission line matching considerations force an even tighter specification on the range of values the output impedance can take.

It has been observed in recent technologies that circuits (e.g., output buffers, drivers, etc.) using passive elements, such as, for example, polysilicon resistors, in series with active devices display tighter variation of output impedance across variations in process, supply voltage and/or temperature (PVT) conditions to which the circuits may be subjected. However, such designs occupy significant silicon area, especially at low values of target output impedance due, at least in part, to electromigration and/or heat dissipation considerations. Such conventional designs are therefore undesirable.

Accordingly, there exists a need for an improved output impedance compensation circuit that does not suffer from one or more of the problems exhibited by conventional output impedance compensation circuitry.

SUMMARY OF THE INVENTION

The present invention meets the above-noted need by providing, in an illustrative embodiment thereof, an enhanced compensation circuit operative to precisely control the output impedance of one or more metal-oxide-semiconductor (MOS) devices to be compensated over variations in PVT conditions to which the one or more MOS devices are subjected. To accomplish this, embodiments of the invention beneficially maintain a substantially constant drain-source voltage across one or more reference MOS devices substantially matched to one or more corresponding MOS devices to be compensated during a calibration cycle of the compensation circuit.

In accordance with an embodiment of the invention, a compensation circuit for compensating an output impedance of at least a first MOS device over PVT variations to which the first MOS device may be subjected includes a first current source generating a first current having a value which is substantially constant and a second current source generating a second current having a value which is programmable as a function of at least one control signal presented to the second current source. A comparator is connected to respective outputs of the first and second current sources and is operative to measure a difference between the respective values of the first and second currents and to generate an output signal indicative of relative magnitudes of the first current and the second current. A processor connected in a feedback arrangement between the comparator and the second current source receives the output signal generated by the comparator and generates the control signal for controlling the second current as a function of the output signal. The processor is operative to control the value of the second current so that the second current is substantially equal to the first current.

In accordance with another embodiment of the invention, a method for compensating an output impedance of at least a first MOS device over variations in at least one of process, supply voltage and temperature conditions to which the at least first MOS device may be subjected, includes the steps of: generating a first current having a value which is substantially constant; generating a second current having a value which is programmable as a function of at least one control signal; measuring a difference between the respective values of the first and second currents and generating an output signal indicative of relative magnitudes of the first current and the second current; generating the at least one control signal as a function of the output signal and controlling the value of the second current so that the second current is substantially equal to the first current; and applying the at least one control signal to the at least first MOS device to thereby compensate the output impedance of the at least first MOS device over variations in at least one of process, supply voltage and temperature conditions to which the at least first MOS device may be subjected.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative compensation circuits adapted to compensate for variations in output impedance due, at least in part, to variations in process, supply voltage and/or temperature (PVT) characteristics of an integrated circuit (IC). It should be understood, however, that the present invention is not limited to these or any other particular circuit arrangements. Rather, the invention is more generally applicable to techniques for reducing the chip area of a bidirectional buffer circuit. To accomplish this, embodiments of the invention utilize a multiplexing arrangement whereby two or more control signals supplied to the bidirectional buffer circuit share a single voltage level translator circuit, thereby reducing the number of voltage level translators required by the buffer circuit.

Although implementations of the present invention are described herein with specific reference to p-channel metal-oxide-semiconductor (PMOS) and n-channel metal-oxidesemiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
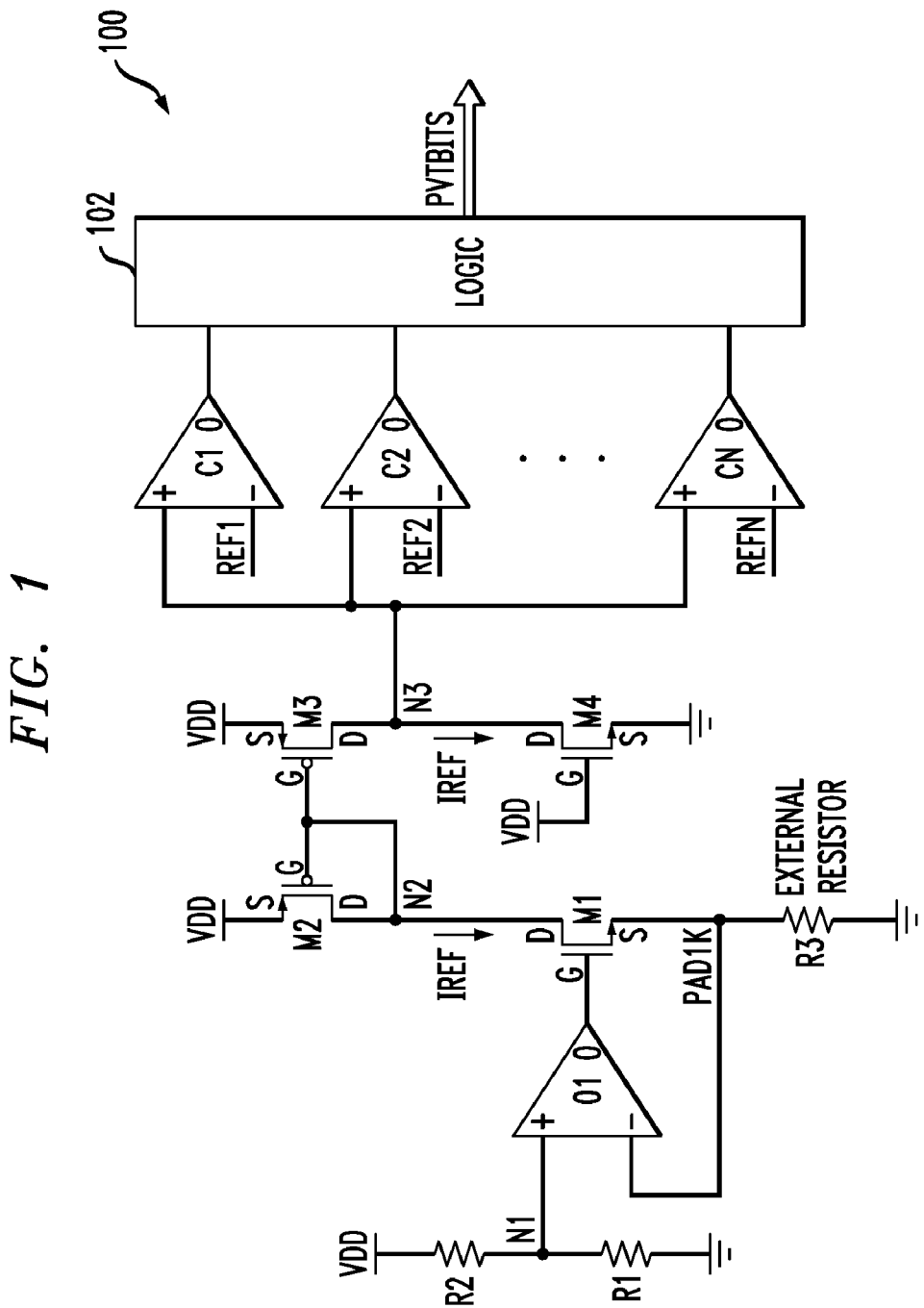
FIG. 1 is a schematic diagram depicting an illustrative compensation circuit in which techniques of the present invention may be implemented.

FIG. 1 is a schematic diagram depicting an illustrative PVT compensation circuit 100 which may be modified to implement techniques of embodiments of the present invention. As apparent from the figure, compensation circuit 100 includes a voltage divider comprised of resistors R1 and R2 connected together in series between a voltage supply of the circuit, which may be VDD, and a voltage return of the circuit, which may be ground. Specifically, a first terminal of resistor R1 is adapted for connection to ground, a second terminal of R1 is connected to a first terminal of resistor R2 at node N1, and a second terminal of R2 is adapted for connection to VDD. The voltage divider generates a reference voltage at node N1 that is proportional to the voltage supply.

Compensation circuit 100 further includes an operational amplifier (op-amp) O1 which clamps a voltage substantially equal to the voltage at node N1 across an external resistor R3 at node PAD1K, assuming O1 has substantially no input offset voltage. Resistor R3 typically has a magnitude on the order of about 1000 (1K) ohms. Specifically, a first input of operational amplifier O1, preferably a non-inverting (+) input, is connected to the voltage divider at node N1, a second input of O1, preferably an inverting (−) input, is connected to a first terminal of resistor R3 at node PAD1K, and a second terminal of R3 is adapted for connection to ground. Thus, with the ratio between resistor R1 and R2 known and the supply voltage VDD known, there will be a known voltage across resistor R3. This, in turn, produces a reference current, IREF, through resistor R3 which is proportional to the supply voltage VDD.

This reference current IREF flows through an NMOS transistor device, M1, and a PMOS transistor device, M2, which are connected together in series with resistor R3. More particularly, a source (S) of device M1 is connected to resistor R3 at node PAD1K, a gate (G) of M1 is connected to an output (O) of operational amplifier O1, a drain (D) of M1 is connected to a drain of device M2 at node N2, a gate of M2 is connected to the drain of M2, and a source of M2 is adapted for connection to VDD. Reference current IREF is mirrored through a current mirror comprised of PMOS devices M2 and M3, to an NMOS transistor device M4. Specifically, a source of device M3 is adapted for connection to VDD, a gate of M3 is connected to the gate of device M2, a drain of M3 is connected to a drain of device M4 at node N3, a gate of M4 is adapted for connection to VDD, and a source of M4 is adapted for connection to ground. Device M4 may be referred to as a monitor device, since it is preferably representative of MOS devices that form the driver stages in an output buffer to be compensated (not shown).

The voltage potential at node N3 varies in proportion to the drain-source resistance of device M4 as well as in proportion to the supply voltage itself. Node N3 is also connected to respective non-inverting inputs of a plurality of comparators, C1, C2, through CN, where N is a nonzero integer. The voltage potential at node N3 is compared against reference voltages REF1, REF2, through REFN supplied to respective inverting inputs of the comparators C1, C2, through CN. Reference voltages REF1, REF2, through REFN, are also proportional to the supply voltage VDD.

Operation of compensation circuit 100 will now be described. When PVT conditions cause the monitor device M4 to exhibit a high output impedance, node N3 is typically higher than all reference voltages REF1 through REFN, thereby forcing the outputs of all the comparators C1 through CN to a logic high state. Likewise, when the output impedance of device M4 is low, node N3 will be at a lower potential than the reference voltages REF1 through REFN, thereby forcing the outputs of all the comparators C1 through CN to a logic low state. Thus, the state of the outputs of the comparators C1 through CN can be considered indicative of the output resistance of device M4 and hence the devices that form the driver stage of a PVT compensated output buffer. The respective outputs of the comparators C1 through CN may be fed to a logic block 102 where they may be further encoded, for example in a binary fashion, to reduce the overall number of output terminals that are required. The output of the logic block 102 preferably forms the PVTBITS which may be used to compensate an output buffer, or other circuit, for variations in PVT conditions to which the buffer may be subjected.

Unfortunately, compensation circuit 100 suffers from the following disadvantage: output impedance of metal-oxide-semiconductor (MOS) devices typically varies by at least a factor of two over variations in PVT conditions. This causes the voltage potential at node N3 to vary widely, resulting in device M3 being driven out of saturation and into a linear region of operation as node N3 approaches the voltage supply rail. This in turn causes the reference current IREF to change making the potential at node N3 a non-linear function of the output resistance of device M4. Moreover, since MOS devices are typically non-linear in nature at large drain-source voltages, the output resistance of device M4 does not remain constant as node N3 varies. This produces a mismatch between the output resistance of device M4 and the respective output resistances of the devices forming the driver stages of the output buffer to be compensated. Consequently, the accuracy of the PVT compensation scheme is undesirably degraded which increases the tolerance range over which the impedance of the output buffer varies. In many applications, this increased tolerance range is unacceptable.

Figure 2:
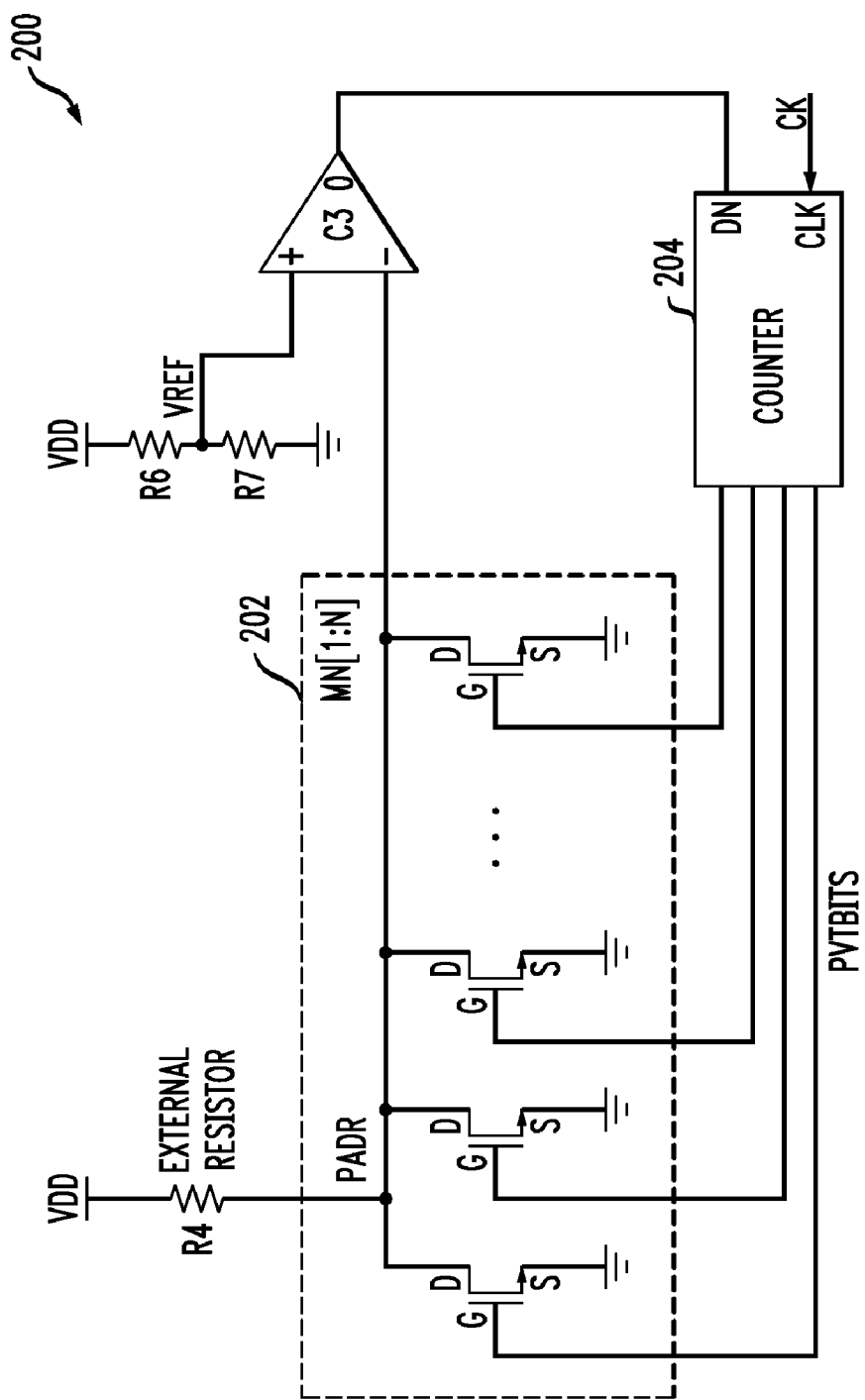
FIG. 2 is a schematic diagram depicting another illustrative compensation circuit in which techniques of the present invention may be implemented.

FIG. 2 is a schematic diagram depicting another exemplary PVT compensation circuit 200 which may be modified to implement techniques of embodiments of the present invention. Circuit 200 employs an external resistor R4 having a resistance value that is equal to or an integral multiple of a target output impedance of an output buffer to be compensated. Resistor R4 is connected between the voltage supply, which may be VDD, and a bank 202 of N substantially identical NMOS devices MN1 through MNN, where N is a non-zero integer, connected in parallel with one another. Specifically, a first terminal of resistor R4 is adapted for connection to VDD, a second terminal of R4 is connected to drains of devices MN1 through MNN at node PADR, and sources of devices MN1 through MNN are adapted for connection to ground, or an alternative voltage return of the circuit. Devices MN1 through MNN are preferably substantially identical to devices forming the driver stages of the PVT compensated output buffer.

Circuit 200 further includes a comparator C3 having a non-inverting input connected to a reference voltage, VREF, generated, for example, using a simple voltage divider comprised of resistors R6 and R7 connected together in series between VDD and ground, although alternative reference sources are contemplated. An inverting input of the comparator C3 is connected to node PADR. An output of the comparator C3 drives a down (DN) input of a digital counter 204. In this instance, the counter 204 is initialized to its highest count value (e.g., all ones) and is then decremented. Alternatively, the output of the comparator may drive an up (UP) input of a counter, in which case the counter would be initialized to its lowest count value (e.g., all zeros). The counter 204 is gated by a clock signal, CK, supplied to the clock input (CLK) of the counter. Output bits, PVTBITS, generated by the counter 204 are connected to respective gates of devices MN1 through MNN in bank 202. The output bits PVTBITS of counter 204 control which device in bank 202 is turned on at any given time. As the number of devices MN1 through MNN in bank 202 that are turned on increases, the impedance at node PADR decreases.

Operation of compensation circuit 200 will be described by way of the example below. The target impedance in this example is assumed to be 50 ohms, and therefore the external resistor R4 is set equal to 50 ohms. Resistors R6 and R7 are preferably chosen to be equal in value to one another, such that reference voltage VREF is half of the supply voltage, or VDD/2. As previously stated, the output bits PVTBITS from counter 204 are initialized to be all high causing all devices MN1 through MNN to be turned on.

With all devices MN1 through MNN turned on, the output impedance of bank 202 will be significantly lower than 50 ohms, thereby causing the voltage at node PADR to be less than VREF (which is equal to VDD/2). With VREF greater than the voltage at node PADR, the output of comparator C3 will be a logic high level. This output voltage, which is supplied to counter 204, causes the counter to decrement with every clock cycle until the output impedance of bank 202, as measured at node PADR, is equal to approximately 50 ohms. This occurs when the voltage potential at node PADR is equal to or slightly greater than VREF, causing the output of comparator C3 to switch to a logic low level and hence stop counter 204 from decrementing. The digital output bits PVTBITS stored in counter 204 under such a state can be sent to the output buffer to produce an output impedance that is relatively constant over variations in PVT conditions to which the output buffer may be subjected, provided the calibration cycle described above is exercised frequently.

The above PVT compensation technique, however, also suffers from the same issues described above in conjunction with compensation circuit 100 shown in FIG. 1. More particularly, the voltage potential at node PADR can vary significantly over the calibration cycle causing the non-linear behavior of the MOS devices to impact the accuracy of the compensation. Moreover, this PVT compensation approach requires the use of an external resistor that is closely matched to the target output impedance. Since the target output impedance is typically on the order of a few tens of ohms, the external resistor R4 will also have to be a few tens of ohms causing the series resistance contributions from bond wire, routing along the integrated circuit (IC) package substrate, etc. to significantly affect the accuracy of the matching. For example, a series resistance of only 2 ohms can cause a four percent loss of accuracy in the compensation of a nominal output impedance of 50 ohms. The smaller the target output impedance, the more the accuracy will be undesirably impacted.

Figure 3:
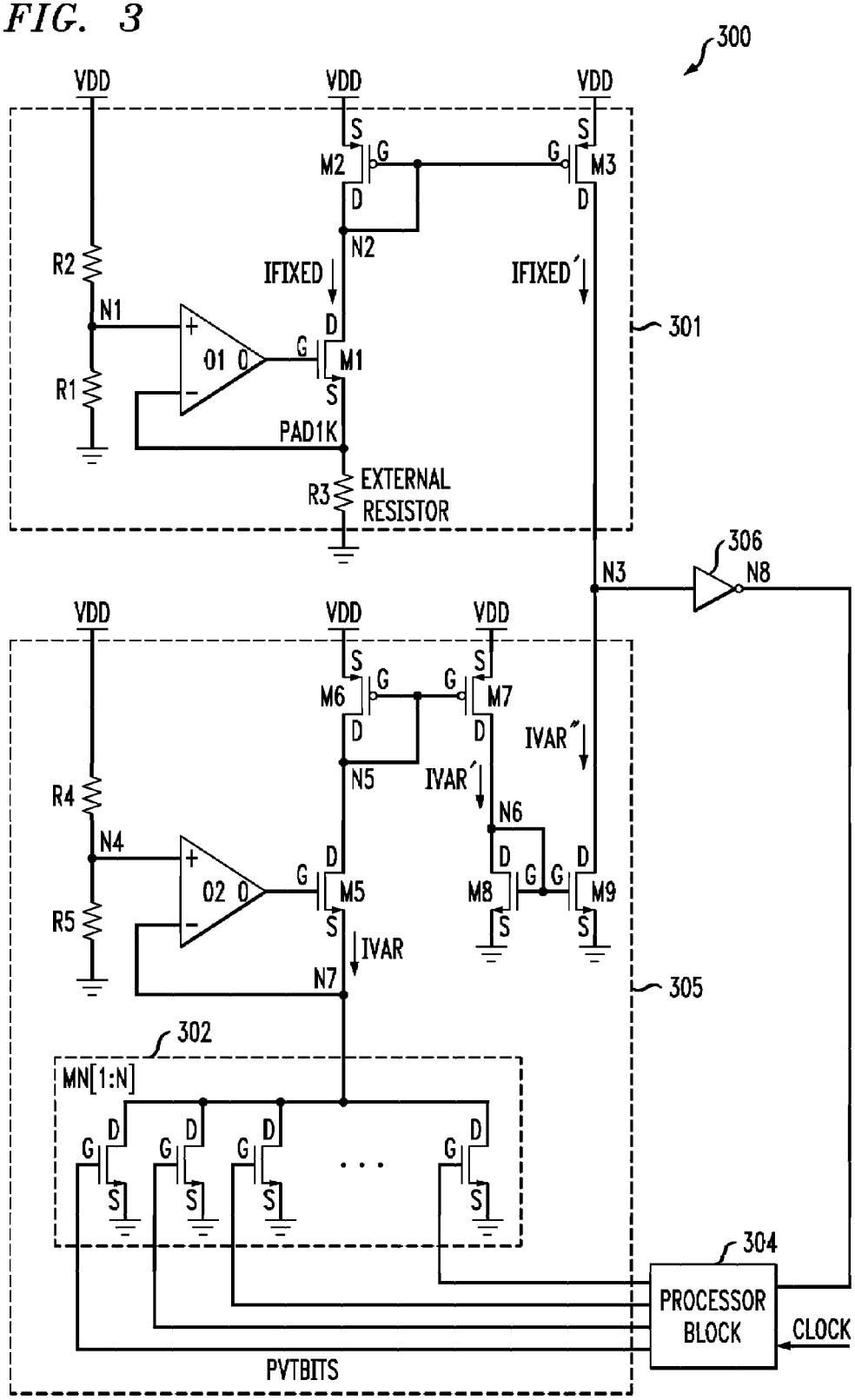
FIG. 3 is a schematic diagram depicting an exemplary compensation circuit adapted to compensate an output impedance of one or more MOS devices, in accordance with an embodiment of the present invention.

FIG. 3 is a schematic diagram of an exemplary PVT compensation circuit 300, formed in accordance with an embodiment of the invention. Circuit 300 overcomes one or more shortcomings of compensation circuits 100 and 200 depicted in FIGS. 1 and 2, respectively. Circuit 300 is preferably operative to compensate a buffer circuit, such as, for example, an output buffer (not shown), for variations in PVT conditions to which the buffer circuit may be subjected.

Circuit 300 includes a first voltage divider comprised of resistors R1 and R2 which generates a first reference voltage that is proportional to the voltage supply. Specifically, a first terminal of resistor R1 is adapted for connection to the voltage supply, which may be VDD, a second terminal of R1 is connected to a first terminal of resistor R2 at node N1, and a second terminal of R2 is adapted for connection to a voltage return of the circuit, which may be ground. The voltage potential at node N1 may be determined by selecting the values of resistors R1 and R2 according to the formula:

$$V_{N1} = VDD \times \frac{R1}{R1 + R2},$$

where $V_{N1}$ is the voltage potential at node N1, and R1 and R2 are the resistance values of resistors R1 and R2, respectively. Thus, if resistors R1 and R2 are selected to be equal in value to one another, the voltage at node N1 will be VDD/2. It is to be understood that alternative circuits may be employed for generating a voltage (e.g., bandgap voltage reference, etc.), as will be known by those skilled in the art. For this discussion, it is assumed that the supply voltage, and hence the voltage potential at node N1, is constant.

The voltage potential at node N1 is clamped across an external resistor R3 (e.g., on the order of about 1000 ohms) by a first operational amplifier O1. More particularly, a first input of operational amplifier O1, which may be a non-inverting (+) input, is connected to node N1, and a second input, which may be an inverting (−) input, is connected to a first terminal of resistor R3 at node PAD1K, a second terminal of R3 is adapted for connection to ground. An output of operational amplifier O1 preferably drives a gate (G) of an NMOS device M1, and a source (S) of M1 is connected to the external resistor R3 at node PAD1K, so that M1 functions as a source follower in this configuration. Assuming an input offset of operational amplifier O1 is negligible, the voltage potential at node PAD1K will be substantially equal to the voltage potential at node N1, and hence the voltage at node PAD1K will also be proportional to supply voltage.

A current, IFIXED, flowing through resistor R3 is preferably replicated by a first current mirror comprised of PMOS devices M2 and M3. Specifically, sources of devices M2 and M3 are adapted for connection to VDD, a drain of M2 is connected to a drain of device M1 at node N2, gates of M2 and M3 are connected to the drain of M2 at node N2, and a drain of M3 is connected to node N3. Assuming the voltage potential at node N3 is substantially equal to the voltage potential at node N2, the current IFIXED' flowing into node N3 will be substantially equal in magnitude to current IFIXED flowing through resistor R3. In other embodiments of the invention, the current IFIXED' flowing into node N3 may be a prescribed ratio of the current flowing through resistor R3, depending, for example, on the size of device M3 relative to the size of device M2 (e.g., channel width-to-length ratios). It is to be understood that various other circuitry for accurately replicating a reference current are contemplated by the present invention, including, but not limited to, cascode current mirrors, Widlar current mirrors, Wilson current mirrors, etc., as will be known by those skilled in the art. Thus, the first voltage divider, first operational amplifier O1, external resistor R3 and the first current mirror, together, form a first current source 301 operative to generate a current IFIXED' which is substantially constant, assuming the supply voltage VDD is substantially constant.

Circuit 300 further includes a second voltage divider comprised of resistors R4 and R5 which generates a second reference voltage that is proportional to the voltage supply. Specifically, a first terminal of resistor R4 is adapted for connection to VDD, a second terminal of R4 is connected to a first terminal of resistor R5 at node N4, and a second terminal of R5 is adapted for connection to ground. The voltage potential at node N4 may be determined as follows:

$$V_{N4} = VDD \times \frac{R5}{R4 + R5},$$

where $V_{N4}$ is the voltage at node N4, and R4 and R5 are the resistance values of resistors R4 and R5, respectively. The values of resistors R4 and R5 are preferably selected so that a voltage potential at node N4 is nominally equal to a logic low output voltage, Vol, specification for the buffer circuit to be compensated. For example, the Vol specification for a buffer may be 0.4 volt for HSTL or 0.28 volt for SSTL. Likewise, the voltage at node N4 may be set to be substantially equal to a logic high output voltage, Voh, specification for the buffer circuit. As previously stated, alternative circuits (e.g., bandgap voltage reference, etc.) may be employed for generating a reference voltage, as will be known by those skilled in the art. Moreover, the respective reference voltages generated at nodes N1 and N4 may alternatively be supplied by a single voltage source.

The voltage potential at node N4 is clamped across a bank 302 of N substantially identical NMOS devices, MN1 through MNN, where N is a nonzero integer, by a second operational amplifier O2. Devices MN1 through MNN in bank 302 are preferably substantially identical to devices forming driver stages of the PVT compensated buffer circuit. More particularly, a first input of operational amplifier O2, which may be a non-inverting (+) input, is connected to node N4, and a second input, which may be an inverting (−) input, is connected to the bank 302 of devices at node N7. An output of operational amplifier O2 preferably drives a gate of an NMOS device M5, and a source of MS is connected to the bank 302 of devices at node N7. Device M5 is thus configured as a source follower. Devices MN1 through MNN in bank 302 are preferably connected in parallel with one another. Specifically, drains of devices MN1 through MNN are connected together at node N7, and sources of MN1 through MNN are adapted for connection to ground.

A current, IVAR, flowing through the devices in bank 302 is preferably replicated by a second current mirror comprised of PMOS devices M6 and M7. Specifically, sources of devices M6 and M7 are adapted for connection to VDD, a drain of M6 is connected to a drain of device M5 at node N5, gates of M6 and M7 are connected to the drain of M6 at node N5, and a drain of M7 is connected to node N6. Assuming the voltage potential at node N6 is substantially equal to the voltage potential at node N5, the current IVAR' flowing into node N6 will be substantially equal in magnitude to current IVAR flowing through the devices in bank 302. Current IVAR will vary in magnitude as a function of which of the devices MN1 through MNN in bank 302 are turned on at any given time.

This current, IVAR', is again replicated by a third current mirror comprised of NMOS devices M8 and M9. More particularly, sources of devices M8 and M9 are adapted for connection to ground, a drain of M8 is connected to the drain of device M7 at node N6, gates of M8 and M9 are connected to the drain of M8 at node N6, and a drain of M9 is connected to the drain of device M3 at node N3. Assuming the voltage potential at node N3 is substantially equal to the voltage potential at node N6, the current IVAR" flowing into device M9 will be substantially equal in magnitude to the current IVAR. As stated above, various other circuitry may be employed for accurately replicating a reference current, including, for example, cascode current mirrors, Widlar current mirrors, Wilson current mirrors, etc., as will be known by those skilled in the art. Thus, the second voltage divider, second operational amplifier O2, second and third current mirrors, and bank of devices 302, together, form a second current source 305 operative to generate a current IVAR" having a magnitude which is programmable as a function of one or more control signals presented thereto.

The signal at node N3 is preferably buffered, such as by an inverter 306 having an input connected to node N3. Alternatively, a non-inverting circuit may be used to buffer the signal at node N3. The voltage at an output of inverter 306, which will be a logical complement of the voltage at node N3, is preferably fed to a processor block 304 which generates a plurality of digital bits, PVTBITS. Processor block 304 is operative to receive a clock signal, CLOCK, for controlling timing in the processor block. The digital output bits PVTBITS of processor block 304 are supplied to gate inputs of devices MN1 through MNN in bank 302 and control which device or devices in the bank are turned on at any given time. The number of output PVTBITS generated by processor block 304 preferably matches the number of devices in bank 302, with each device being driven by, and corresponding to, a unique one of the digital bits. It is to be understood that the invention is not limited to any particular number of digital output bits. As the number of devices MN1 through MNN in bank 302 that are turned on increases, the impedance at node N7 decreases, and vice versa.

As apparent from the figure, the currents IFIXED' and IVAR" are equal to each other, assuming the input of inverter 306 draws no or negligible current. The voltage at node N3 will therefore rise and fall as a function of a difference between reference currents IFIXED and IVAR. For example, when IVAR is greater than IFIXED, the voltage at node N3 will tend to decrease in an attempt to drive device M9 into a nonsaturation region of operation. Likewise, when IFIXED is greater than IVAR, the voltage at node N3 will tend to increase in an attempt to drive device M3 into a nonsaturation region of operation.

By way of example only, an operation of compensation circuit 300 will now be described. It is assumed that the digital bits PVTBITS generated by processor block 304 are initialized to a logic low level, thereby turning off devices MN1 through MNN in bank 302. With devices MN1 through MNN turned off, only negligible current, primarily leakage current, flows through bank 302, thereby causing current IVAR to be substantially small (e.g., in the nanoampere (nA) range). The value of the current IFIXED, on the other hand, stays fixed at a nominal value (e.g., a few hundred microampere (µA)). Since current IFIXED is substantially greater in magnitude than current IVAR, the voltage potential at node N3 will be pulled substantially close to VDD, since, as previously stated, the current flowing into and out of node N3 must be equal. The output of inverter 306 at node N8 will therefore be a logic low level. Hence, inverter 306 functions as a comparator for determining whether current IVAR is greater than current IFIXED.

Processor block 304 is preferably configured such that a low to high level transition detected at node N8 is indicative of an end of the calibration cycle. While node N8 is low, the processor block 304 increments a count value of the output PVTBITS, preferably monotonically. In an illustrative embodiment, processor block 304 may be implemented as a digital counter (e.g., binary counter). As the processor block 304 increments the digital bits fed to the device bank 302, the number of devices MN1 through MNN that are turned on increases accordingly. As a result, the current IVAR through bank 302 increases while the drain-source voltage, as measured at node N7, remains substantially the same. This process continues until the current through device bank 302 becomes equal to, or a constant multiple of (e.g., as may be determined by a ratio of the current mirrors M8/M9 verses M2/M3), the fixed current IFIXED. A rising transition at node N8 is detected under this situation causing processor block 304 to stop incrementing the digital bits further. The digital bits PVTBITS hence represents a digital code for compensating one or more output buffers having devices forming driver stages of the one or more PVT compensated buffer circuits that are substantially matched to devices MN1 through MNN in bank 302. The calibration cycle can be run at prescribed (e.g., periodic) intervals so as to automatically adjust the amount of PVT compensation "on the fly" as required.

In accordance with another embodiment of the invention, processor block 304 may be operative to decrement, rather than increment, the digital output bits PVTBITS with each clock cycle. In this instance, the digital bits are all initialized to a logic high level, thereby turning on all devices MN1 through MNN in bank 302. With devices MN1 through MNN all turned on, the current IVAR flowing through bank 302 will be at its maximum. Fixed current IFIXED is preferably selected so as to be substantially less than the current IVAR when IVAR is at its maximum magnitude. Consequently, the voltage potential at node N3 will be close to ground causing the output of the inverter at node N8 to be a logic high level.

Processor block 304, in this embodiment, is preferably configured to recognize a high to low level transition at node N8 as being indicative of an end of the calibration cycle. While node N8 is high, processor block 304 decrements the count value of the output PVTBITS, preferably monotonically, although this is not a requirement. As processor block 304 decrements the digital bits fed to the device bank 302, the number of devices MN1 through MNN that are turned on decreases accordingly. As a result, the current IVAR through bank 302 decreases while the drain-source voltage, as measured at node N7, remains substantially the same. This process continues until the current through device bank 302 becomes equal to, or a constant multiple of (e.g., as may be determined by a ratio of the current mirrors M8/M9 verses M2/M3), the fixed current IFIXED. A falling transition at node N8 is detected under this situation causing processor block 304 to stop decrementing the digital bits further. The digital bits PVTBITS hence represents a digital code for compensating one or more output buffers having devices forming driver stages of the one or more PVT compensated buffer circuits that are substantially matched to devices MN1 through MNN in bank 302.

Processor block 304 need not be implemented as a digital counter, but rather may comprise circuitry for implementing a binary search algorithm. A binary search algorithm is a well-known technique for finding a particular value in a sorted list. It makes progressively better guesses and closes in on the desired value by comparing an element halfway with what has been determined to be an element too low in the list and one too high in the list. A binary search essential determines the median element in a list, compares its value to the one you are searching for, and determines if the value is greater than, less than, or equal to the desired value. A guess that turns out to be too high becomes the new top of the list, and one that is too low becomes the new bottom of the list. The next guess in the binary search is preferably halfway between the new top and bottom of the list. Pursuing this strategy iteratively results in a narrowing of the search by a factor of two each time to thereby speed up the search.

By way of example only, processor block 304, in implementing a binary search methodology, is preferably operative to perform the following steps: (a) set all digital bits PVTBITS to a logic low level and to check if the comparator output at node N8 is low; (b) set all digital bits PVTBITS to a logic high level and determine if the output of the comparator at node N8 is high; (c) set the digital bits PVTBITS to a midpoint between the values in steps (a) and (b). If the comparator output is high, the optimum setting lies in the first half. If the comparator output is low, the optimum setting lies in the second half; (d) set the digital bits PVTBITS to the midpoint of the first or second half, depending on the comparator output in step (c); and (e) repeat steps (c) and (d) until consecutive bit states are detected which cannot be divided further.

The proposed PVT compensation scheme maintains the drain-source voltage of the compensated devices at a substantially constant value during the entire calibration cycle, thereby minimizing current mirroring inaccuracies that typically occur in standard compensation approaches. Not only does the compensation methodology in accordance with embodiments of the present invention maintain a constant drain-source voltage across the compensated devices, it also sets this voltage nominally equal to the logic low output voltage (Vol) or logic high output voltage (Voh) specification of the output buffer to be compensated, thereby minimizing mismatches due primarily to nonlinearity of MOS device characteristics. An advantage of the techniques of embodiments of the invention is that an output buffer can be realized having significantly tighter control over output impedance variation compared to conventional compensation approaches.

At least a portion of the compensation techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A compensation circuit for compensating an output impedance of at least a first metal-oxide-semiconductor (MOS) device over variations in at least one of process, supply voltage and temperature conditions to which the at least first MOS device may be subjected, the compensation circuit comprising:

a first current source operative to generate a first current having a value which is substantially constant;

a second current source operative to generate a second current having a value which is programmable as a function of at least one control signal presented to the second current source;

a comparator connected to respective outputs of the first and second current sources, the comparator being operative to measure a difference between the respective values of the first and second currents and to generate an output signal indicative of relative magnitudes of the first current and the second current; and a processor connected in a feedback arrangement between the comparator and the second current source, the processor receiving the output signal generated by the comparator and generating the at least one control signal as a function of the output signal, the processor being operative to control the value of the second current so that the second current is substantially equal to the first current, whereby the at least one control signal generated by the processor is adapted to compensate the output impedance of the at least first MOS device over variations in at least one of process, supply voltage and temperature conditions to which the at least first MOS device may be subjected;

wherein the second current source comprises:

a reference source generating a voltage which is proportional to a supply voltage of the compensation circuit;

a voltage clamp operative to clamp the voltage generated by the reference source across at least a second MOS device, a gate of the at least second MOS device receiving the at least one control signal, the at least second MOS device being substantially matched to the at least first MOS device to be compensated; and a current mirror circuit operative to generate the second current, the second current being substantially matched to a current flowing through the at least second MOS device.

2. The compensation circuit of claim 1, wherein the first current source comprises:

a reference source generating a voltage which is proportional to a supply voltage of the circuit;

a voltage clamp operative to clamp the voltage generated by the reference source across a resistor external to the circuit; and a current mirror for generating the first current, the first current being a function of a current flowing through the resistor.

3. The compensation circuit of claim 2, wherein the voltage clamp comprises:

an operational amplifier including a first input for receiving the voltage generated by the reference source, a second input for detecting a voltage across the resistor, and an output generating a signal indicative of a difference between the voltage generated by the reference source and the voltage across the resistor; and an NMOS device configured as a source follower, the NMOS device including a gate connected to the output of the operational amplifier and a source connected to the resistor.

4. The compensation circuit of claim 2, wherein the first current is substantially matched to the current flowing through the resistor.

5. The compensation circuit of claim 2, wherein the first current is a prescribed ratio of the current flowing through the resistor.

6. The compensation circuit of claim 1, wherein the first current source comprises:

a reference source generating a voltage which is proportional to a supply voltage of the compensation circuit;

an operational amplifier having a noninverting input connected to the reference source and an inverting input connected to an external resistor;

an NMOS device having a source connected to the inverting input of the operational amplifier and a gate connected to an output of the operational amplifier; and a current mirror comprising first and second PMOS devices, a drain of the first PMOS device being connected to a drain of the NMOS device, gates of the first and second PMOS devices being connected to the drain of the NMOS device, sources of the first and second PMOS devices being adapted for connection to the supply voltage of the compensation circuit, and a drain of the second PMOS device generating the first current.

7. The compensation circuit of claim 1, wherein the current mirror circuit comprises:

a first current mirror operative to source a replicated current which is substantially equal to the current flowing through the at least second MOS device; and a second current mirror operative to receive the replicated current and to sink the second current, the second current being a function of the replicated current.

8. The compensation circuit of claim 7, wherein the second current is substantially matched to the current flowing through the at least second MOS device.

9. The compensation circuit of claim 7, wherein the second current is a prescribed ratio of the current flowing through the at least second MOS device.

10. The compensation circuit of claim 1, wherein the current mirror circuit comprises:

a first current mirror including first and second PMOS devices, a drain of the first PMOS device being connected to the voltage clamp, gates of the first and second PMOS devices being connected to the drain of the first PMOS device, sources of the first and second PMOS device being adapted for connection to the supply voltage of the compensation circuit, and a drain of the second PMOS device generating a replicated current, the replicated current being substantially equal to the current flowing through the at least second MOS device; and a second current mirror including first and second NMOS devices, a drain of the first NMOS device being connected to the drain of the second PMOS device, gates of the first and second NMOS devices being connected to the drain of the first NMOS device, sources of the first and second NMOS device being adapted for connection to a voltage return of the compensation circuit, and a drain of the second NMOS device sinking the second current, the second current being substantially equal to the current flowing through the at least second MOS device.

11. The compensation circuit of claim 1, wherein the voltage clamp comprises:

an operational amplifier including a first input for receiving the voltage generated by the reference source, a second input for detecting a voltage across the at least second MOS device, and an output generating a signal indicative of a difference between the voltage generated by the reference source and the voltage across the at least second MOS device; and an NMOS device configured as a source follower, the NMOS device including a gate connected to the output of the operational amplifier and a source connected to the at least second MOS device.

12. The compensation circuit of claim 1, wherein the processor comprises a digital counter, the counter including a first input for receiving the output signal generated by the comparator and a second input for receiving a timing signal, the counter being operative to generate a digital output code at an output thereof which is indicative of whether the first current is greater in magnitude than the second current.

13. A compensation circuit for compensating an output impedance of at least a first metal-oxide-semiconductor (MOS) device over variations in at least one of process, supply voltage and temperature conditions to which the at least first MOS device may be subjected, the compensation circuit comprising:
a first current source operative to generate a first current having a value which is substantially constant;
a second current source operative to generate a second current having a value which is programmable as a function of at least one control signal presented to the second current source;
a comparator connected to respective outputs of the first and second current sources, the comparator being operative to measure a difference between the respective values of the first and second currents and to generate an output signal indicative of relative magnitudes of the first current and the second current; and
a processor connected in a feedback arrangement between the comparator and the second current source, the processor receiving the output signal generated by the comparator and generating the at least one control signal as a function of the output signal, the processor being operative to control the value of the second current so that the second current is substantially equal to the first current;
wherein the processor is operative: (i) to set the at least one control signal to a logic low level and to check if the output signal generated by the comparator is a low level; (ii) to set the at least one control signal to a logic high level and to determine if the output signal generated by the comparator is a high level; (iii) to set the at least one control signal to a midpoint between the low and high levels in steps (i) and (ii) and determine whether the output signal is high, indicating that a desired setting for the at least one control signal lies in a lower half of a range between the low and high levels, or whether the output signal is low, indicating that the desired setting for the at least one control signal lies in an upper half of the range between the low and high levels; (iv) to set the at least one control signal to a midpoint of the lower or upper half, depending on the comparator output in step (iii); and (v) repeat steps (iii) and (iv) until consecutive bit states are detected which cannot be divided further.

14. The compensation circuit of claim 1, wherein the at least first MOS device comprises a first plurality of MOS devices to be compensated and the at least second MOS device comprises a second plurality of MOS devices, each MOS device in the second plurality of MOS devices being substantially matched to a corresponding MOS device in the first plurality of MOS devices to be compensated.

15. The compensation circuit of claim 14, wherein the second plurality of MOS devices are formed in close relative proximity to the first plurality of MOS devices, such that the second plurality of MOS devices is subjected to substantially the same variations in process, supply voltage and temperature conditions to which the first plurality of MOS devices are subjected.

16. The compensation circuit of claim 1, wherein the value of the first current is based at least in part on one of a logic low output voltage (Vol) and a logic high output voltage (Voh) specification of the at least first MOS device to be compensated.

17. An integrated circuit including at least one compensation circuit for compensating an output impedance of at least a first metal-oxide-semiconductor (MOS) device over variations in at least one of process, supply voltage and temperature conditions to which the at least first MOS device may be subjected, the at least one compensation circuit comprising:
a first current source operative to generate a first current having a value which is substantially constant;
a second current source operative to generate a second current having a value which is programmable as a function of at least one control signal presented to the second current source;
a comparator connected to respective outputs of the first and second current sources, the comparator being operative to measure a difference between the respective values of the first and second currents and to generate an output signal indicative of relative magnitudes of the first current and the second current; and
a processor connected in a feedback arrangement between the comparator and the second current source, the processor receiving the output signal generated by the comparator and generating the at least one control signal as a function of the output signal, the processor being operative to control the value of the second current so that the second current is substantially equal to the first current, whereby the at least one control signal generated by the processor is adapted to compensate the output impedance of the at least first MOS device over variations in at least one of process, supply voltage and temperature conditions to which the at least first MOS device may be subjected;
wherein the second current source comprises:
a reference source generating a voltage which is proportional to a supply voltage of the compensation circuit;
a voltage clamp operative to clamp the voltage generated by the reference source across at least a second MOS device, a gate of the at least second MOS device receiving the at least one control signal, the at least second MOS device being substantially matched to the at least first MOS device to be compensated; and
a current mirror circuit operative to generate the second current, the second current being substantially matched to a current flowing through the at least second MOS device.

18. The integrated circuit of claim 17, wherein the processor comprises a digital counter, the counter including a first input for receiving the output signal generated by the comparator and a second input for receiving a timing signal, the counter being operative to generate a digital output code at an output thereof which is indicative of whether the first current is greater in magnitude than the second current.

19. An integrated circuit including at least one compensation circuit for compensating an output impedance of at least a first metal-oxide-semiconductor (MOS) device over variations in at least one of process, supply voltage and temperature conditions to which the at least first MOS device may be subjected, the at least one compensation circuit comprising:
a first current source operative to generate a first current having a value which is substantially constant;
a second current source operative to generate a second current having a value which is programmable as a function of at least one control signal presented to the second current source;

a comparator connected to respective outputs of the first and second current sources, the comparator being operative to measure a difference between the respective values of the first and second currents and to generate an output signal indicative of relative magnitudes of the first current and the second current; and a processor connected in a feedback arrangement between the comparator and the second current source, the processor receiving the output signal generated by the comparator and generating the at least one control signal as a function of the output signal, the processor being operative to control the value of the second current so that the second current is substantially equal to the first current;

wherein the processor is operative: (i) to set the at least one control signal to a logic low level and to check if the output signal generated by the comparator is a low level; (ii) to set the at least one control signal to a logic high level and to determine if the output signal generated by the comparator is a high level; (iii) to set the at least one control signal to a midpoint between the low and high levels in steps (i) and (ii) and determine whether the output signal is high, indicating that a desired setting for the at least one control signal lies in a lower half of a range between the low and high levels, or whether the output signal is low, indicating that the desired setting for the at least one control signal lies in an upper half of the range between the low and high levels; (iv) to set the at least one control signal to a midpoint of the lower or upper half, depending on the comparator output in step (iii); and (v) repeat steps (iii) and (iv) until consecutive bit states are detected which cannot be divided further.

20. A method for compensating an output impedance of at least a first metal-oxide-semiconductor (MOS) device over variations in at least one of process, supply voltage and temperature conditions to which the at least first MOS device may be subjected, the method comprising the steps of:

generating a first current having a value which is substantially constant;

generating a second current having a value which is programmable as a function of at least one control signal;

measuring a difference between the respective values of the first and second currents and generating an output signal indicative of relative magnitudes of the first current and the second current;

generating the at least one control signal as a function of the output signal and controlling the value of the second current so that the second current is substantially equal to the first current; and applying the at least one control signal to the at least first MOS device to thereby compensate the output impedance of the at least first MOS device over variations in at least one of process, supply voltage and temperature conditions to which the at least first MOS device may be subjected.

* * * * *